(12) United States Patent
Qin et al.

(10) Patent No.: US 9,293,063 B2
(45) Date of Patent: *Mar. 22, 2016

(54) FINGER POSITION SENSING FOR HANDHELD SPORTS EQUIPMENT

(71) Applicant: Cypress Semiconductor Corporation, San Jose, CA (US)

(72) Inventors: Yuanyuan Qin, Shanghai (CN); Hua (Ivan) Liu, Shanghai (CN)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/467,511

(22) Filed: Aug. 25, 2014

(65) Prior Publication Data

US 2015/0080154 A1  Mar. 19, 2015

Related U.S. Application Data

(63) Continuation of application No. 12/006,352, filed on Dec. 31, 2007, now Pat. No. 8,814,713.

(51) Int. Cl.
| | |
|---|---|
| *A63B 9/00* | (2006.01) |
| *G09B 19/24* | (2006.01) |
| *A63B 59/00* | (2015.01) |
| *A63B 71/06* | (2006.01) |
| *G01R 27/26* | (2006.01) |
| *G08B 7/06* | (2006.01) |

(52) U.S. Cl.
CPC ............ *G09B 19/24* (2013.01); *A63B 59/0014* (2013.01); *A63B 60/06* (2015.10); *A63B 60/08* (2015.10); *A63B 60/10* (2015.10); *A63B 71/0622* (2013.01); *G01R 27/2605* (2013.01); *G08B 7/06* (2013.01); *A63B 2059/0022* (2013.01); *A63B 2060/464* (2015.10); *A63B 2220/10* (2013.01); *A63B 2220/56* (2013.01)

(58) Field of Classification Search
CPC .. G01R 27/2605; G06F 3/044; H03K 17/962; A63B 71/0622; A63B 2059/022; G08B 7/06
See application file for complete search history.

(56) References Cited

U.S. PATENT DOCUMENTS

| | | |
|---|---|---|
| 4,113,378 A | 9/1978 | Wirtz |
| 5,226,650 A | 7/1993 | Suttner |
| 5,377,541 A | 1/1995 | Patten |

(Continued)

FOREIGN PATENT DOCUMENTS

| | | |
|---|---|---|
| CN | 2471369 E | 1/2002 |
| CN | 1547497 A | 11/2004 |

OTHER PUBLICATIONS

U.S. Appl. No. 12/006,352: "Finger Position Sensing for Handheld Sports Equipment" Yuanyuan Qin et al., filed Dec. 31, 2007; 41 pages.

(Continued)

*Primary Examiner* — Jay Liddle
*Assistant Examiner* — Alex F. R. P. Rada, II

(57) ABSTRACT

A training device that includes a receiving surface on its handle, multiple capacitive sensor elements disposed within multiple grip areas on the receiving surface, a sense circuit configured to compare the capacitance measurements with threshold capacitance values and generate a signal when the capacitance measurements indicate a touch on the grip area and an indicator.

20 Claims, 8 Drawing Sheets

(56) References Cited

U.S. PATENT DOCUMENTS

| | | | |
|---|---|---|---|
| 5,655,223 | A | 8/1997 | Cozza |
| 5,681,993 | A | 10/1997 | Heitman |
| 5,779,555 | A | 7/1998 | Nomura et al. |
| 6,012,995 | A | 1/2000 | Martin |
| 6,033,370 | A | 3/2000 | Reinbold et al. |
| 6,184,871 | B1 | 2/2001 | Teres et al. |
| 6,196,932 | B1 | 3/2001 | Marsh et al. |
| 6,273,819 | B1 | 8/2001 | Strauss et al. |
| 6,527,655 | B2 | 3/2003 | Sims et al. |
| 6,722,889 | B1 | 4/2004 | Page et al. |
| 8,884,901 | B2 | 11/2014 | Landau et al. |
| 2005/0134470 | A1 | 6/2005 | Bos |
| 2007/0229468 | A1 | 10/2007 | Peng et al. |
| 2009/0048044 | A1 | 2/2009 | Oleson et al. |
| 2013/0021278 | A1* | 1/2013 | Landau et al. ............... 345/173 |

OTHER PUBLICATIONS

Cypress Semiconductor Corporation, "PSoC Mixed-Signal Array," Data Sheet, 2005-2007, found at http://www/cypress.com.

English Translation of Abstract Regarding International Application No. PCT/CN2007/003739 (ZL 01208273.2); 1 page.

International Search Report for PCT/CN2007/003739 dated Oct. 16, 2008.

International Written Opinion for PCT/CN2007/003739 dated Oct. 16, 2008.

Ted Tsui, "Migrating from CSR to CSD," Cypress Semiconductor Corporation, Application Note AN2408, Feb. 8, 2007, http://www.cypress.com.

USPTO Advisory Action for U.S. Appl. No. 12/006,352 dated May 20, 2011; 2 pages.

USPTO Final Rejection for U.S. Appl. No. 12/006,352 dated Mar. 17, 2011; 11 pages.

USPTO Final Rejection for U.S. Appl. No. 12/006,352 dated Apr. 2, 2014; 12 pages.

USPTO Non Final Rejection for U.S. Appl. No. 12/006,352 dated Sep. 27, 2010; 9 pages.

USPTO Non Final Rejection for U.S. Appl. No. 12/006,352 dated Oct. 28, 2013; 13 pages.

USPTO Notice of Allowance for U.S. Appl. No. 12/006,352 dated Jun. 27, 2014; 5 pages.

\* cited by examiner

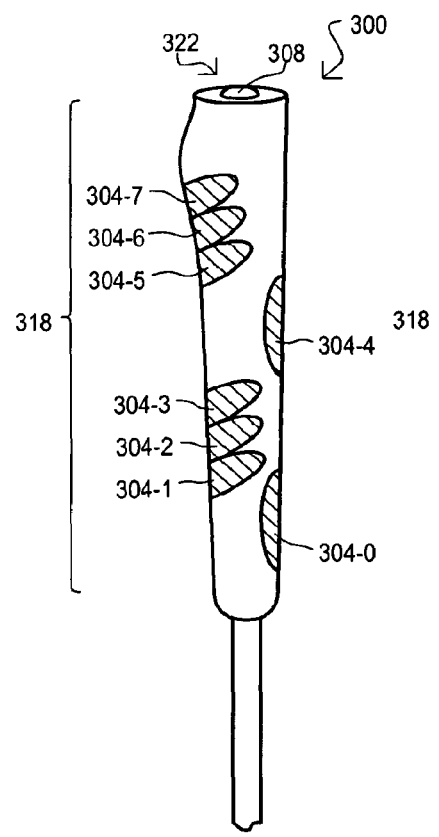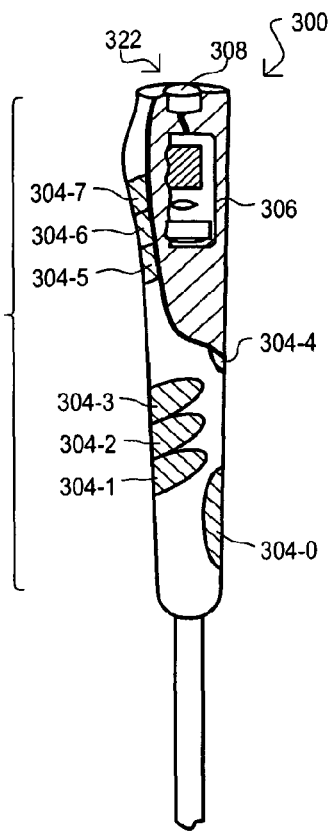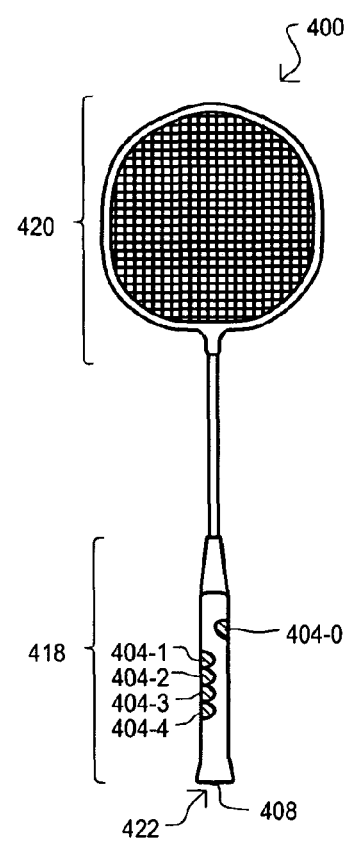
FIG. 3A  FIG. 3B  FIG. 4
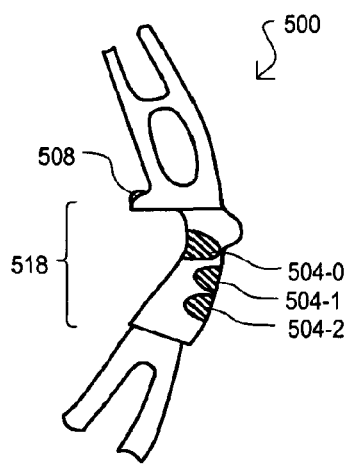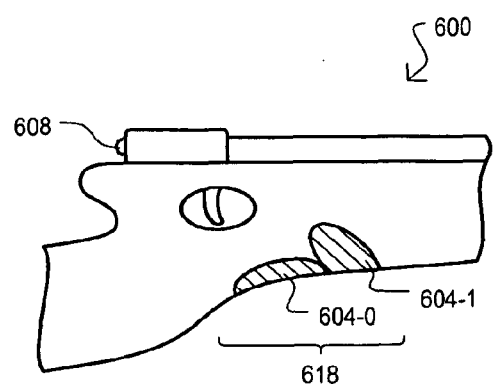
FIG. 5  FIG. 6

FINGER POSITION SENSING FOR HANDHELD SPORTS EQUIPMENT

CROSS-REFERENCE TO RELATED APPLICATIONS

This application is a continuation of U.S. application Ser. No. 12/006,352, filed Dec. 31, 2007, all of which is incorporated by reference herein in its entirety.

TECHNICAL FIELD

The present invention relates generally to education and training for sports equipment, and more particularly to the teaching of finger positions on sports related equipment.

BACKGROUND OF THE INVENTION

Many sports include handheld equipment. Such sports equipment can include projectile type equipment, such as balls or flying discs, and can also include equipment used to strike projectiles, such as bats, racquets, or mallets. Still further, such sports equipment can further include more complicated devices such as bows and competition shooting pistols or rifles.

When learning a sport that includes handheld equipment, the position of a hand, in particular the fingers, on the equipment can impact how a participant progresses. Learning improper finger position can adversely impact how one plays a sport, and can hinder one from advancing in the sport.

Conventionally, training for proper finger position on a piece of sports equipment is typically accomplished with a trainer giving personalized instruction. Such an arrangement can be time consuming and expensive. Alternatively, instruction manuals, videos or other visual aids can provide visual displays showing proper finger position on sports equipment from various views. However, such instructional approaches can be difficult for some people to interpret, and a learner is never given any indication when or if proper finger position has been achieved.

BRIEF DESCRIPTION OF THE DRAWINGS

FIGS. 3A and 3B are two views showing a fourth embodiment.
FIG. 4 is a diagram showing a fifth embodiment.
FIG. 5 is a partial view showing a sixth embodiment.
FIG. 6 is a partial view showing a seventh embodiment.

DETAILED DESCRIPTION

Various embodiments of the present invention will now be described in detail with reference to a number of drawings. The embodiments show devices, systems, and methods for teaching finger position for a sports equipment device. The devices and methods can provide for "hands on" learning with a piece of equipment that can provide essentially immediate feedback to inform a learner when proper finger position has been achieved.

Figure 1:
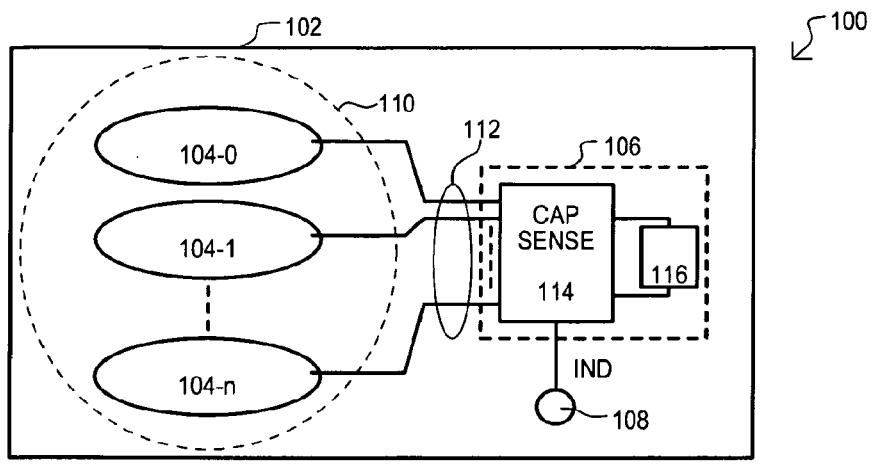
FIG. 1 is a block schematic diagram of a first embodiment.

A device according to a first embodiment is shown in a block schematic diagram in FIG. 1, and designated by the general reference character 100. A device 100 can include a body 102, a number of sense regions 104-0 to 104-n, a capacitance sense assembly 106, and an indicator 108. A body 102 can have the form of a piece of sports equipment that is held by one or both hands, and can include a projectile device, as well as a device that is retained in the hands. A device 100 can be functional as a piece of sports equipment, or alternatively, may be a training device only, not intended for use in actual competition. As but two very particular examples, in the latter case, a device 100 can have the shape of a bat, racquet or paddle for striking a projectile, but not be designed to actually strike an object. In contrast, in the former case, device 100 can actually be employed in the sports activity.

Sense regions (104-0 to 104-n) can be formed on an outer surface of a body, in hand receiving region 110. A hand receiving region 110 can be a location on the device for receiving one or more portions of the hand, preferably, positions where fingers contact the device. Sense regions (104-0 to 104-n) can have a physical placement corresponding to a proper finger position. Each sense region (104-0 to 104-n) can include a capacitor structure having at least two plates. A capacitance presented by such structures can vary according to the proximity of an object (e.g., finger) to the sense region (104-0 to 104-n). For example, the closer a finger is to a sense region (104-0 to 104-n) the greater the capacitance presented by the sense region.

Capacitance sense assembly 106 can be connected to sense regions (104-0 to 104-n) by a number of leads 112. Leads 112 can provide an electrical connection between one or more capacitor plates of each sense region (104-0 to 104-n) and capacitance sense assembly 106. For example, in one arrangement, one plate of each sense region (104-0 to 104-n) can be connected by a different lead to a corresponding input of capacitance sense assembly 106, while opposing plates of such sense regions (104-0 to 104-n) can be commonly connected to a reference node (e.g., ground).

Capacitance sense assembly 106 can include a capacitance sense circuit 114 and a power supply receptacle 116. A capacitance sense circuit 114 can preferably be a single integrated circuit device that can detect a capacitance at any of sense regions (104-0 to 104-n) by connecting such regions to a sense node. Preferably, a capacitance sense circuit 114 can be provided by a PsoC® Mixed-Signal Array manufactured by Cypress Semiconductor Corporation of San Jose, Calif., USA. A power supply receptacle 116 can provide power to capacitance sense circuit 114 and indicator 108. Preferably, a power supply receptacle 116 can be battery receptacle for receiving a disposable or rechargeable battery to enable the device 100 to be handled in a normal fashion, unimpeded by cords or other connections. However, in alternate embodiments, a power supply receptacle can be an input for receiving suitable power supply levels from an external source, such as an AC-DC converter.

While capacitance sensing can occur according to various techniques, in particular approaches, a capacitance sense circuit 114 can sense a capacitance presented by a sense region (104-0 to 104-$n$) according to relaxation oscillator techniques, or alternatively, using a switched capacitor and a sigma delta modulator. One example of such an approach is shown in "Migrating from CSR to CSD", by Ted Tsui an Application Note published by Cypress Semiconductor Corporation, the contents of this article are incorporated by reference herein.

Based on capacitance sensing results generated by capacitance sense circuit 114, a capacitance sense assembly 106 can output of indicator value IND to indicator 108.

An indicator 108 can be formed on body 102 in a position suitable for providing an indication to a user of the device. Such an indication can be activated in response to indicator value IND. For example, in the event the indicator 108 is a visual indicator (e.g., light emitting diode—LED, or liquid crystal display—LCD), the indicator 108 can be positioned at a location visible by a person holding the device 100. In the event the indicator 108 is an audio indicator (e.g., speaker), the indicator 108 can be positioned to ensure the sound can reach a person holding the device 100. In the event the indicator 108 is a tactile indicator (e.g., vibrator or rumbler), the indicator 108 can be positioned proximate to the hand to ensure vibrations can be transmitted to the hand.

In this way, a sports related device can include multiple sense regions at locations corresponding to finger positions, and can generate and indicator value according to capacitances sensed at such sense regions.

Figures 2A, 2B:
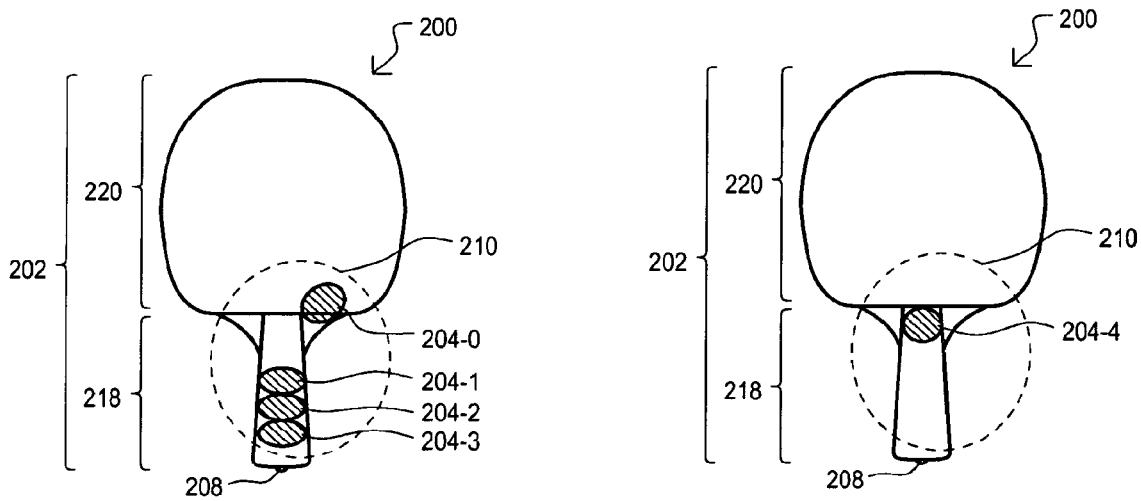
FIGS. 2A to 2C are various views of a second embodiment.
Figures 2C, 2D:
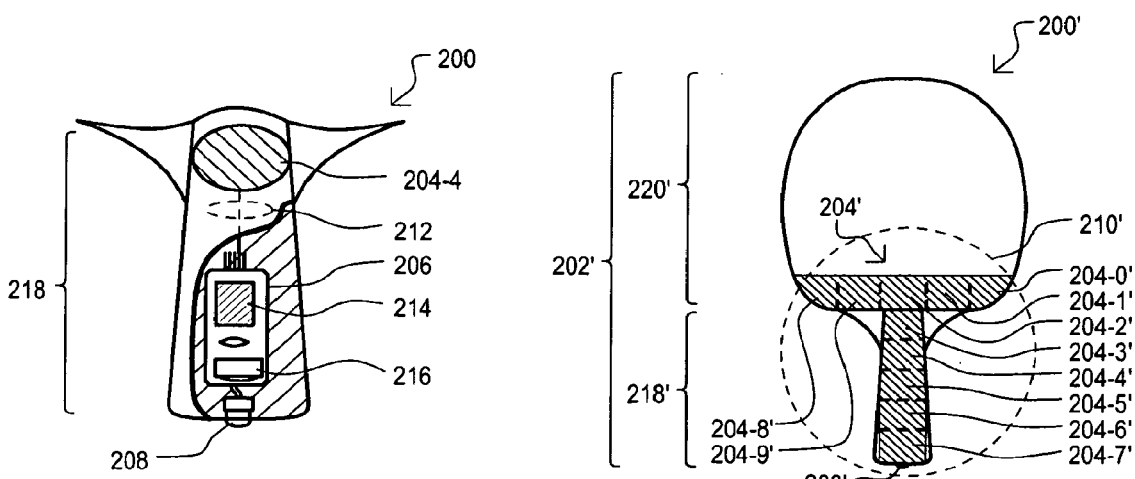
FIG. 2D is a diagram showing a third embodiment.

Referring now to FIGS. 2A to 2C, a device according to a second embodiment is shown in a number of views, and designated by the general reference character 200. A second embodiment 200 can be a racquet (also referred to as a paddle, or bat) used in the sport of table tennis. In one very particular arrangement, the embodiment of FIGS. 2A to 2C can be one variation of that shown in FIG. 1.

Referring now to FIG. 2A, a first side of device 200 is shown in a plan view. A device 200 can include a body 202 having a handle portion 218 and a striking portion 220. FIG. 2A shows the location of four sense regions 204-0 to 204-3. Sense regions (204-0 to 204-3) can have physical locations corresponding to a particular grip type and/or hand size or shape. As understood from FIG. 2A, sense regions can reside outside of handle portion 218. That is, a handle portion 218 can be but one portion of a hand receiving region 210 of the device 200. More particularly, a different type of grip could have multiple sense regions formed in a striking portion 220. FIG. 2A also shows an indicator 208 formed, in this particular embodiment, on a bottom of handle portion 218. Preferably, and indicator 208 is a visual indicator, even more preferably an LED.

FIG. 2B shows a second side of device 200 in a plan view. In the particular arrangement shown, a second side of device 200 can include a fifth sense region 204-4.

Again, it is emphasized that the sense region locations shown in FIGS. 2A and 2B correspond to one particular type of grip, and other sense regions could be added, or sense regions positions changed to corresponding to grip type and/or hand size or shape.

Referring to FIG. 2C, device 200 is shown in a partial cutaway view. FIG. 2C shows a portion of handle portion 218, cut away to reveal the position of a sense assembly 206 within handle portion 218 and below an outer surface of device 200. Sense assembly 206 can include a capacitance sense circuit 214 and power supply receptacle 216. Preferably, a sense assembly 206 includes capacitance sense circuit 214 and additional circuit components, such as passive circuit components, formed on a circuit board. Leads 212 from sense regions (204-0 to 204-$n$) can be connected to sense assembly 206, thus allowing capacitance sense circuit 214 to sense a capacitance presented by such sense regions (204-0 to 204-$n$).

In this way, a sports device having a handle portion and projectile striking portion can include sense regions formed on an outer surface connected to a capacitance sense regions for indicating a desired finger position when properly holding the device.

While the embodiment of FIGS. 2A to 2C show an arrangement with discrete and separate sense regions, alternate embodiments can include a contiguous sense area that is logically dividable into different sense regions. One such arrangement in shown in FIG. 2D.

Referring now to FIG. 2D, one side of a device 200' according to a third embodiment is shown in a plan view. A third embodiment 200' can also be a racquet used in table tennis. However, unlike the arrangement of FIGS. 2A to 2C, the embodiment of FIG. 200' can include a sensor area 204', shown by hatching, that can include multiple capacitance sensors. Such capacitance sensor can be logically dividable into multiple regions. As but one example, different capacitances sensors can be assigned to a same sense region. Thus, in a sensing operation, capacitance can be determined on a region by region basis. Assignment of sensors to particular regions can be programmable, allowing a same set of capacitance sensors to be programmed differently depending upon type of grip and/or size or shape of hand. The particular arrangement of FIG. 2D shows sensor area 204' logically divided into various sense regions 204-0' to 204-9'. The arrangement of FIG. 2D can be "programmed" to provide the same finger training position as FIG. 2A, by sensing from sense regions 204-1', 204-3', 204-4' and 204-5' on one side. Assuming the same sensor area exists on an opposing side, capacitance sensing can be performed on sense region 204-1' on such an opposing side.

In this way, a sports device can have a large finger position sensing area, programmable to sense particular regions of the area to sense different types of grips and/or accommodate different hand sizes or shapes.

Various other embodiments, provided by way of example only, will now be described.

Referring now to FIGS. 3A and 3B, a device according to a fourth embodiment is shown in a number of views, and designated by the general reference character 300. A fourth embodiment 300 can be a handle of a device that is gripped by two hands, in this case a handle of a golf club or golf club shaped device. In one very particular arrangement, the embodiment of FIGS. 3A and 3B can be one variation of that shown in FIG. 1.

Referring now to FIG. 3A, a device 300 can include a handle portion 318. A number of sense regions (304-0 to 304-7) can be formed on an outer surface of handle portion 318. In the particular example shown, each different sense region (304-0 to 304-7) can represent a desired location of finger. A visual indicator 308 can be formed on surface region 322 for easy viewing by a user.

FIG. 3B is a cutaway version of the same view as FIG. 3A, showing one example of a placement of sense assembly 306 within handle portion 318. In the particular example shown, sense assembly 306 can have the same essential construction as that shown in FIG. 2C, including a capacitance sense circuit 314 and a power supply receptacle 316.

In this way, a sports device can have sense regions for detecting finger positions of for two hands based on changes in capacitance at such sense regions.

Referring now to FIG. 4, a device according to a fifth embodiment is shown in a number of views, and designated by the general reference character 400. A fifth embodiment 400 can be a stringed racquet device, in this case a badminton racquet or a badminton racquet shaped device. In one very particular arrangement, the embodiment of FIG. 4 can be one variation of that shown in FIG. 1.

Referring now to FIG. 4, a device 400 can include a handle portion 418 and a projectile striking portion 420. A number of sense regions (404-0 to 404-4) can be formed on an outer surface of handle portion 418. In this example, like the previous example, each different sense region (404-0 to 404-4) can represent a desired location of finger. A visual indicator 408 can be formed on surface region 422.

From the previous embodiments noted above, the present invention can be directed various other hand held sports equipment, including but not limited to, mallets (such as those used in croquet or polo), poles (such as those used pole vaulting or balancing), javelins, other types of bats (such as those used for baseball or cricket), watercraft related equipment (such as oars or paddles), or sports weaponry (such as that used in weapon related martial arts, or fencing).

Other embodiments can be related to sports weaponry that can transmit projectiles. Two examples of such embodiments are shown in FIGS. 5 and 6.

Referring now to FIG. 5, a device according to a sixth embodiment is shown in a number of views, and designated by the general reference character 500. A sixth embodiment 500 can be the handle of a device that can transmit a projectile, in this case a handle of a bow for shooting arrows. In one very particular arrangement, the embodiment of FIG. 5 can be one variation of that shown in FIG. 1.

Referring now to FIG. 5, a device 500 can include a handle portion 518 having a number of sense regions (504-0 to 504-3) formed on an outer surface. A visual indicator 508 can be formed on surface region for easy viewing.

Referring now to FIG. 6, a device according to a seventh embodiment is shown in a number of views, and designated by the general reference character 600. A seventh embodiment 600 can have the shape of another device that can transmit a projectile, in this case a competition shooting rifle. In one very particular arrangement, the embodiment of FIG. 6 can be one variation of that shown in FIG. 1.

Referring now to FIG. 6, a device 600 can include a handle portion 618 having a number of sense regions (604-0 and 604-1). A visual indicator 608 can be formed on surface region 622 for easy viewing.

In this way, weaponry related sports devices can teach proper finger position by utilizing capacitance sensing techniques.

While embodiments above have shown devices corresponding to those normally held throughout a sports event, and devices for striking or otherwise transmitting projectiles, other embodiments can include projectile devices transmitted by the hand. Various examples of such embodiments will now be described.

Figure 7:
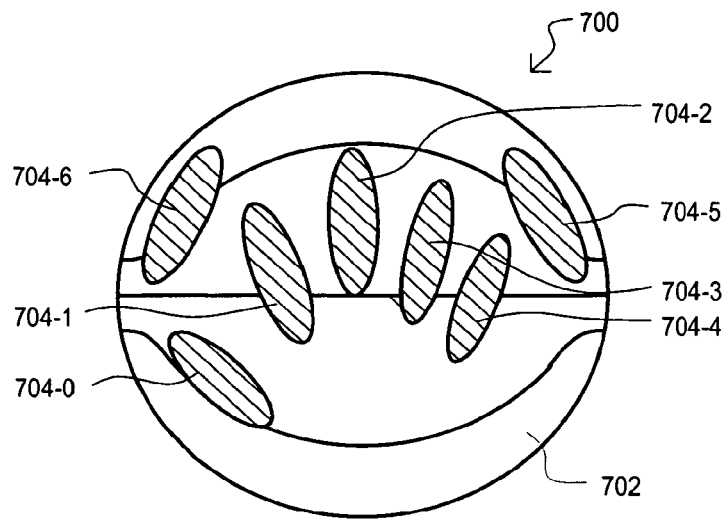
FIG. 7 is a plan view showing another embodiment.

Referring now to FIG. 7, a device according to another embodiment is shown in a plan view, and designated by the general reference character 700. A second embodiment 700 can be a projectile, in this case a basketball. In one very particular arrangement, the embodiment of FIG. 7 can be one variation of that shown in FIG. 1.

Referring now to FIG. 7, a device 700 can include a body 702 having an outer surface on which can be formed sense regions (704-0 and 704-6). An indicator (not shown) can also be situated on the device. As will be described in more detail with respect to the embodiments of FIGS. 8A and 8B, a device 700 can include a sense assembly formed within body 702, or on an outer surface of body 702.

While the embodiment of FIG. 7 shows discrete sense regions (704-0 and 704-6), in accordance with the embodiment shown in FIG. 2D, alternate embodiments can include a large sense area logically dividable into more than one sense region, with a capacitance of each sense region being separately detectable.

In this way, finger positions for a hand thrown projectile can be learned utilizing multiple capacitance sense regions, each corresponding to a different finger position.

Figures 8A, 8B, 9:
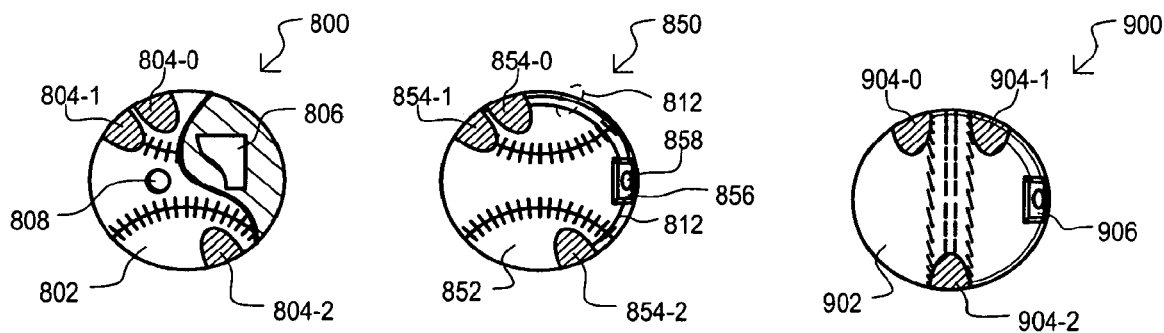
FIGS. 8A and 8B are views showing yet other embodiments.
FIG. 9 is a plan view of another embodiment.

Referring now to FIGS. 8A and 8B, examples of devices according to two more embodiments are shown in various views. The embodiments of FIGS. 8A and 8B show another sports related projectile device, in this case a baseball. In one very particular arrangement, the embodiments of FIGS. 8A and 8B can be two variations on that shown in FIG. 1.

Referring now to FIG. 8A, a device according to another embodiment is shown in a partial cutaway view, and designated by the general reference character 800. Device 800 can include a body 802 having an outer surface on which can be formed sense regions (804-0 to 804-2). A device 800 can also include a visual indicator 808 recessed within body 802 below outer surface, but still visible to a user. A sense assembly 806 can be formed within body 802, and can have the same essential construction as that shown in FIG. 2C, including a capacitance sense circuit and a power supply receptacle.

Referring now to FIG. 8B, a device according to another embodiment is shown in a plan view, and designated by the general reference character 850. Like the embodiment of FIG. 8A, device 850 can include a body 852 having an outer surface with sense regions (854-0 to 854-2). Unlike the arrangement of FIG. 8A, device 850 can include leads 812 and a sense assembly 856 formed on an outer surface of body 852. Further, in the particular example shown, a visual indicator 858 can be integrated with sense assembly 856.

Referring now to FIG. 9, a device according to another embodiment, like that of FIGS. 8A and 8B is shown in a plan view, and designated by the general reference character 900. The embodiment of FIG. 9 can be another example of a thrown object, in this case a cricket ball having a different finger pattern than that of FIGS. 8A and 8B. In one very particular arrangement, the embodiment of FIG. 9 can be one variation of that shown in FIG. 1.

Referring now to FIG. 9, a device 900 can include a body 902 with an outer surface on which can be situated sense regions (904-0 to 904-2). In the embodiment of FIG. 9, a sense assembly 906 can be formed within or on an outer surface of the device 900.

While the embodiments of FIGS. 7 to 9 have shown generally spherical shapes, alternate embodiments can include thrown objects having other shapes. For example, other variations can be applied to an American football shaped object. Yet another example is shown in FIG. 10.

Figure 10:
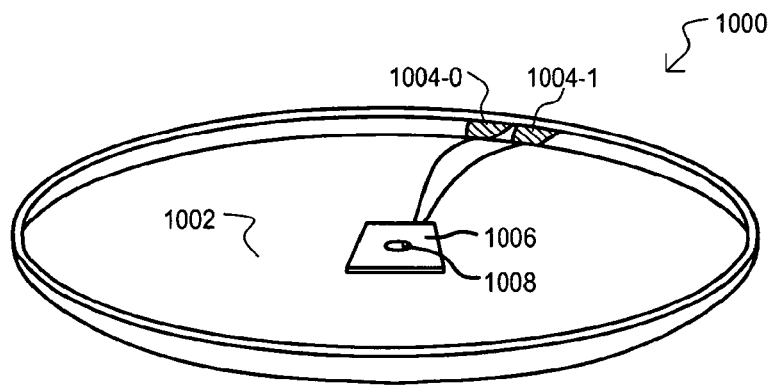
FIG. 10 is a plan view of a further embodiment.

Referring now to FIG. 10, a device according to another embodiment is shown in a plan view, and designated by the general reference character 1000. Device 1000 can be a non-spherical projectile, in this case a "flying disc". In one very particular arrangement, the embodiment of FIG. 10 can be one variation of that shown in FIG. 1.

Referring now to FIG. 10, a device 1000 is shown, in an inverted arrangement with respect to its typical orientation. A device 1000 can include a body 1002 having an outer surface on which can be formed sense regions (1004-0 and 1004-1). An indicator 1008 and sense assembly 1006 can also be formed on the outer surface.

From the previous embodiments noted above, the present invention can be directed various additional hand held sports equipment, including but not limited to, shots (used in shot putting), a discus, a hammer, or types of balls not mentioned above.

While embodiments described above have shown arrangements in which a sense assembly can be disposed within an object, other embodiments have shown arrangements in which a sense assembly can be formed on an outer surface of a device. Such an arrangement can be achieved with a finger position sensing kit that can be configured for various shaped objects. One example of such kit is shown in FIGS. 11A to 11C.

Figure 11A:
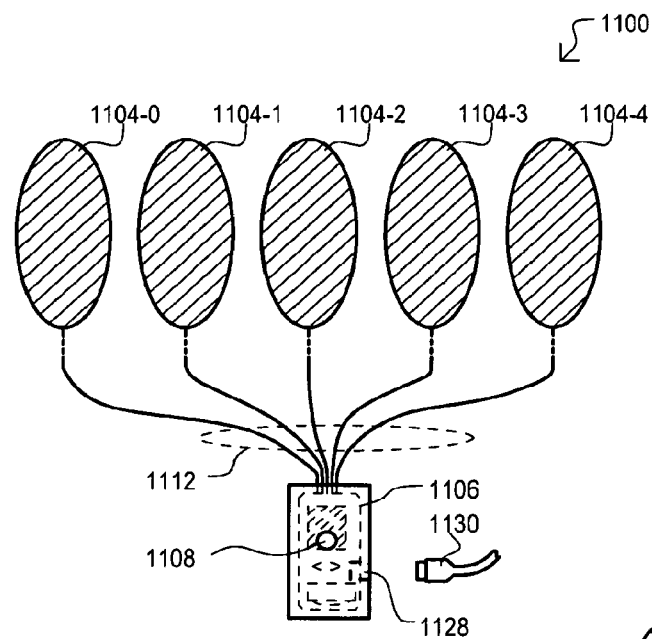
FIGS. 11A to 11C are diagrams showing finger position sensing system according to an embodiment.

Referring to FIG. 11A, sensing kit 1100 can include various portions of like those of devices shown above, including sense regions 1104-0 to 1104-4, leads 1112, sense assembly 1106, and an indicator 1108. Sense assembly 1106 can be encapsulated in a packaging 1126. Optionally, a sense assembly 1106 can include a physical input/output (I/O) port 1128 to allow programming of capacitance sense circuit within sense assembly 1106. A physical I/O port 1128 can be configured to receiving a programming cable 1130. As but one example, a physical I/O port 1128 can be electrically connected to a serial port built-in to a capacitance sense circuit within sense assembly 1106.

Figure 11B:
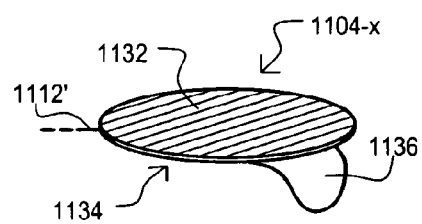

Referring now to FIG. 11B, one example of a sense region that can be included in an embodiment like that of FIG. 11A is shown in a perspective view and designated by the general reference character 1104-x. A sense region 1104-x can include a sense surface 1132 and an opposing attachment surface 1134. A sense surface 1132 can allow for the detection of variations in capacitance by way of lead connection 1112'. An attachment surface 1134 can allow sense region 1104-x to be affixed permanently, or alternatively, temporarily to a surface of a sports device. In the particular example shown, an attachment surface 1134 can include an adhesive exposed by removing covering 1136.

Figure 11C:
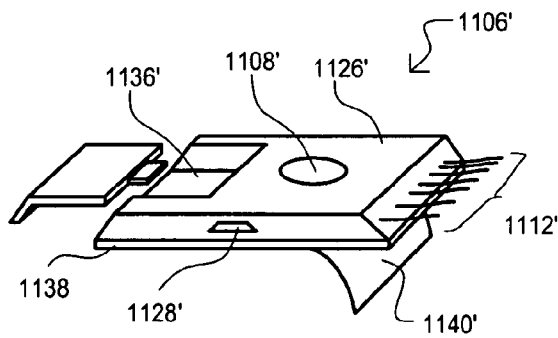

Referring now to FIG. 11C, one example of a sense assembly structure that can be included in an embodiment like that of FIG. 11A is shown in a perspective view and designated by the general reference character 1106'. A package 1126' can surround and provide mechanical protection for a sense assembly. As but one example, a package 1126' can be formed by an epoxy resin. A visual indicator 1108' can be recessed within package 1126'. An openable recess 1136 can be formed within package 1126', and can allow access to a power supply receptacle (not shown). An optional I/O port is shown as 1128'. In the very particular example of FIG. 11C, a sense assembly structure 1106' can further include an attachment surface 1138. An attachment surface 1138 can include a flexible layer, as well as an adhesive exposed by removing covering 1140'.

In this way, a sensing kit can include a number of sense regions that can be attached at desired locations of a sports device. In addition or alternatively, a sense assembly can also be attached at a location of the same sports device. In this way, a sensing kit can accommodate various types of sports devices.

As noted above, in particular arrangements, the presence of a finger can be sensed according to a capacitance change. Particular examples of such structures for detecting such a capacitance change will now be described.

Figure 12A:
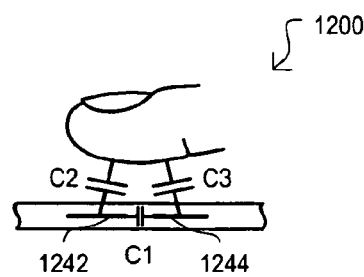
FIGS. 12A and 12B are diagrams of a sensor circuit that can be included in sense regions of the embodiments.
Figure 12B:
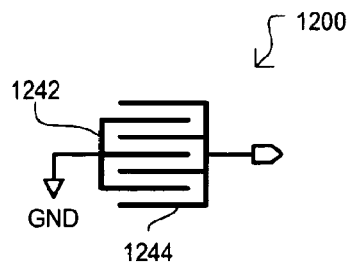

Referring now to FIGS. 12A and 12B, an example of a capacitance sensor structure that can be included, an optionally repeated, in a sense region will now be described. FIG. 12A is side view diagram showing one example of a capacitance sensor 1200. A capacitance sensor 1200 can include a first plate 1242 that can be connected to one potential node (for example ground), and a second plate 1244 that can be connected to an input node of a capacitance sense circuit. As a finger gets closer to first and second plates (1242 and 1244) a capacitance presented at such plates can increase. First and second plates (1242 and 1244) can be essentially coplanar to provide an advantageously thin sense region for attachment to a surface. FIG. 12B is a top plan view of a capacitance sensor 1200 showing one particular interdigitated arrangement of a first and second plate (1242 and 1244).

A capacitance sensor 1200 can form one sense region, or can be repeated multiple times within a same sense region.

In this way, capacitance sensor can have a low profile structure on a surface of a sports device, and thus essentially not disturb the natural feeling of the device.

Figure 13:
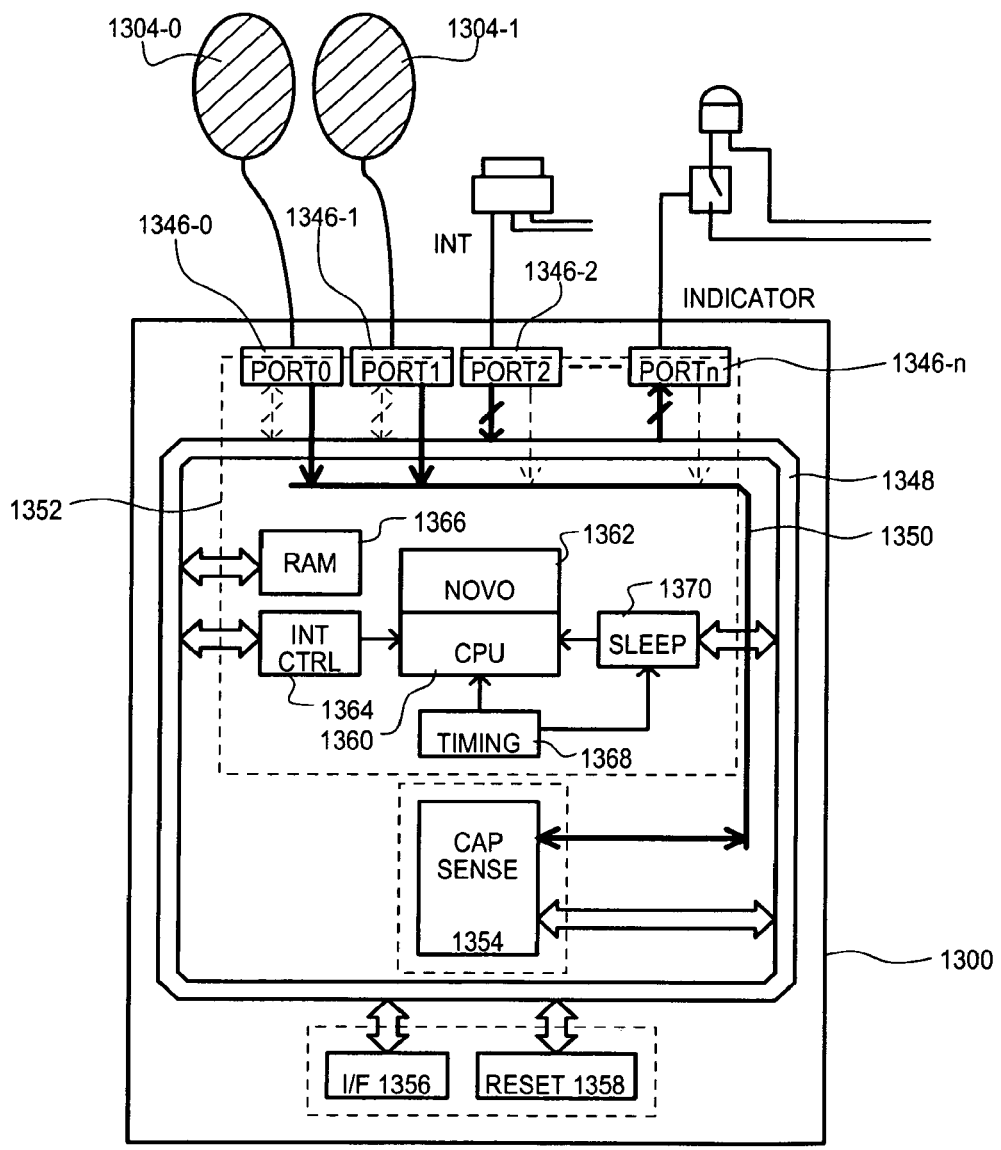
FIG. 13 is a block schematic diagram showing on example of a capacitance sense circuit that can be included in the embodiments.

Referring now to FIG. 13, one very particular example of a capacitance sense circuit is shown in a block schematic diagram and designated by the general reference character 1300. A capacitance sense circuit 1300 can include a number of ports 1346-0 to 1346-n, a digital bus 1348, an analog bus 1350, a processing section 1352, a capacitance sense section 1354, an interface circuit 1356, and a reset circuit 1358. Preferably, capacitance sense circuit 1300 is a single integrated circuit.

While ports (1346-0 to 1346-n) can be dedicated inputs or outputs, in the arrangement of FIG. 13, ports are programmable I/Os. In particular, according to configuration data, a port can be configured as digital I/O or an analog input. A digital I/O can provide access to digital bus 1348, while an analog I/O 1350 can serve as an input to an analog bus. In the particular arrangement shown, ports 1346-0 and 1346-1, connected to sense regions 1304-0 and 1304-1, can be configured as analog inputs. In contrast, port 1346-2 can be configured as a digital input, providing an interrupt input to capacitance sense circuit 1300, while port 1346-n can be configured as a digital output providing an indicator signal. Such an arrangement can allow ports to accommodate different numbers of sense regions, or be configurable to accommodate different sense region configurations.

A digital bus 1348 can provide a data path interconnecting the various circuit sections of capacitance sense circuit 1300 with one another. An analog bus 1350 can provide analog inputs to capacitance sense section 1354. This can allow a capacitance at analog inputs to be measured.

A processor section 1352 can include instructions for controlling the operation of the various circuit sections. In the very particular example of FIG. 13, a capacitance sense circuit 1300 can include a processor 1360, nonvolatile memory 1362, an interrupt control circuit 1364, a random access memory (RAM) 1366, a timing circuit 1368, and a sleep circuit 1370. A processor 1360 can execute predetermined instructions stored in nonvolatile memory 1362, in response to predetermined input events. A nonvolatile memory 1362 can store instructions and configuration data for capacitance sense circuit 1300. Configuration data can establish the configuration of ports (1346-0 to 1346-n), as well as the interconnection of signal paths within the circuit. In particular arrangements, a nonvolatile memory 1362 can store capacitance limit values for comparison against detected capacitance values of sense regions.

An interrupt control circuit 1364 can generate interrupts detectable by processor 1360. As is well known, interrupts can allow a processor to selectively end or otherwise alter a current processing operation. A RAM 1366 can store data values generated by processor. In particular arrangements, a RAM 1366, as opposed to nonvolatile memory 1362, can store capacitance limit values for comparison against detected capacitance values of sense regions. A timing circuit 1368 can provide timing signals to processor and other circuit sections. Preferably, a timing circuit 1368 can have at least two modes, a standard operating mode and a low power, lower frequency mode. A sleep circuit 1370 can enable capacitance sense circuit 1300 to be placed into a low power mode in which non-essential circuit sections are disabled, and the device operates at a lower operating frequency. Such a capability can provide advantageously longer operating life for battery powered embodiments.

A capacitance sense section 1354 can determine a capacitance for sense regions connected to analog bus 1350. In a preferred embodiment, such values can be provided as count values, corresponding to a charging and/or discharging rate of a sense region. Such count values can be accessed via digital bus 1348.

An interface circuit 1356 can allow data to be input or output to the device. In a preferred embodiment, an interface can allow for the capacitance sense circuit to be reconfigured. In particular, an interface circuit 1356 can allow data to be written to nonvolatile memory 1362, thus altering execution code and/or configuration data as but two examples. In this way, a capacitance sense circuit can be reconfigured even after it has been formed in, or attached to a corresponding sports device.

A reset circuit 1358 can control reset operations for the capacitance sense circuit 1300, to enable the system to be reset in the event of error or power cycling. Additionally, a reset circuit 1358 can include a power supply voltage detection circuit that indicates when a power supply level falls below a predetermined level.

Preferably, a capacitance sense circuit 1300 is a single integrated circuit device to allow for a compact sense assembly.

Figure 14:
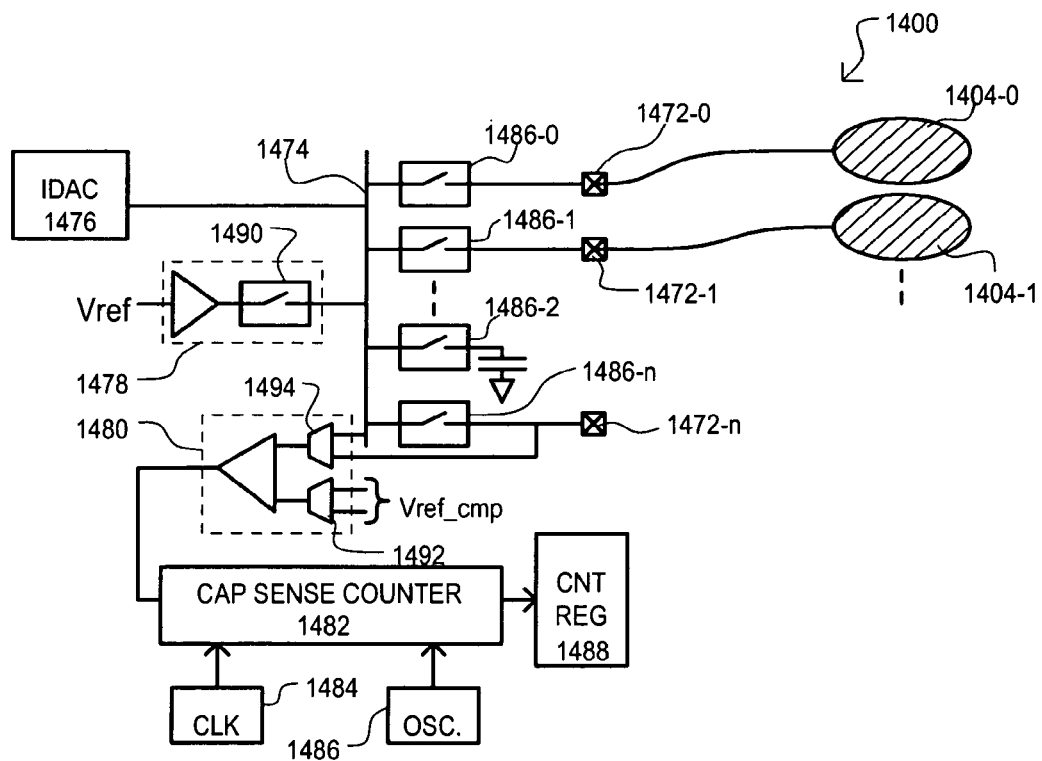
FIG. 14 is a block schematic diagram of a capacitance sense section that can be included in the embodiments.

Referring now to FIG. 14, one example of a capacitance sense section that can be included in the embodiments is shown in a block schematic diagram and designated by the general reference character 1400. A capacitance sense section 1400 can include a number of sensor inputs 1472-0 to 1472-n, a common sense node 1474, a current digital-to-analog converter (IDAC) 1476, a voltage reference circuit 1478, a comparator circuit 1480, a capacitance sense counter 1482, a clock circuit 1484, an oscillator circuit 1486, and an output register 1488.

Sensor inputs (1472-0 to 1472-n) can be connected to common sense node 1474 by corresponding switches 1486-0 to 1486-n. In the particular example shown, sensor inputs 1472-0 and 1472-1 can be connected to sense regions 1404-0 and 1404-1. Thus, by operation of switches (1486-0 and 1486-1), either or both of sense regions (1404-0 and 1404-1) can be connected to a common sense node 1474. In the particular example of FIG. 14, input 1472-n can be connected to common sense node 1474 by switch 1486-n, or directly to comparator circuit 1480. Further, in the arrangement shown, switch 1486-2 can connect common node 1474 to a reference potential (i.e., ground).

In this way, individual sense regions, each corresponding to different finger positions on a sports device, can be connected individually, or in groups, to a common sense node.

An IDAC 1476 can provide a current to a common node 1474. Such an arrangement can allow a common node 1474 to be charged at a predetermined rate. When a sense region (e.g., 1404-0 and 1404-1) is connected to common node 1474, the rate at which the common node charges can reflect a capacitance presented at the common node 1474 (including any sense regions attached thereto). The embodiment of FIG. 14 also includes a voltage reference circuit 1478. A voltage reference circuit 1478 can provide a reference voltage to a common node, by operation of switch 1490.

A comparator circuit 1480 can compare a potential at common node 1474 to a reference voltage selected by a reference multiplexer 1492. Thus, a comparator circuit 1480 can generate a transition when a voltage at common node 1474 exceeds a selected reference voltage. Such an operation can be repeated, charging and discharging the common node 1474. When common node 1474 is connected to a sense region (e.g., 1404-0 and 1404-1), a transition rate of a comparator output signal can reflect a detected capacitance. In the embodiment of FIG. 14, a comparator circuit 1480 can also compare a potential at input node 1472 to a selected reference voltage by operation of multiplexer 1494.

A capacitance sense counter 1482 can generate a count value based on transitions at an output of comparator circuit 1480. A capacitance sense counter 1482 can receive a clock signal from clock circuit 1484 and an oscillation signal from an oscillator circuit 1480. An output register 1484 can capture a count value generated by capacitance sense counter 1482.

In this way, a capacitance sense section can selectively connect sense regions of a sports device to a common sense node. Such a common sense node can be charged with a current. The rate which such a common sense node can be charged and/or discharged can indicate a capacitance of sense regions.

While the above embodiments have shown various devices for training finger positions for a sports device, other embodiments can include methods for training finger positions. Examples of such methods will now be described. As understood from above, methods described below can be executed on a sports device actually used in a sporting event, or can be a device shaped like that used in a sporting event.

Figure 15:
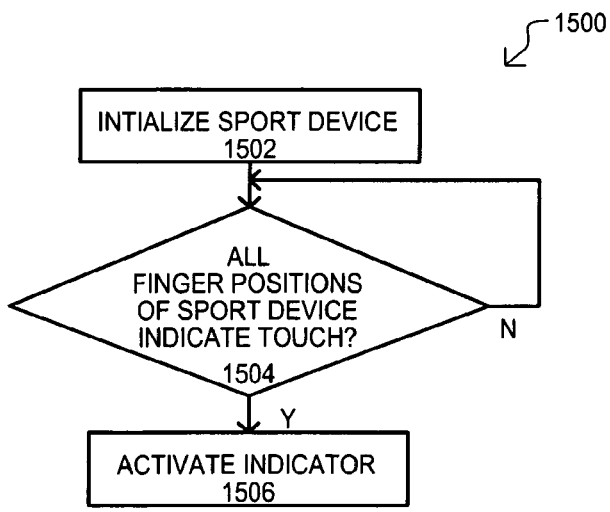
FIG. 15 is a flow diagram showing a first method according to an embodiment.

Referring to FIG. 15, a method for training finger positions for a sports device is shown in a flow diagram and designated by the general reference character 1500. A method 1500 can include initializing the sports device (step 1502). Such a step can include turning the device on, or otherwise applying power to the device. In addition, such a step can further include generating a predetermined indication to show the device is ready to receive a hand. As but one example, an indicator can generate a particular type of pattern to let a user know the device can now be held in the hand.

A method 1500 can then determine if all finger positions of the sports device indicate a touch (step 1504). Such a step can include determining if a capacitance at each finger position indicates contact with a finger.

If all finger positions indicate a touch (Y from 1504), an indication can be generated (step 1506). However, if all finger positions do not indicate a touch (N from 1504), a method can return to monitoring finger positions.

In this way, proper finger positions for a sports device can be detected and acknowledged with an indication.

Figure 16:
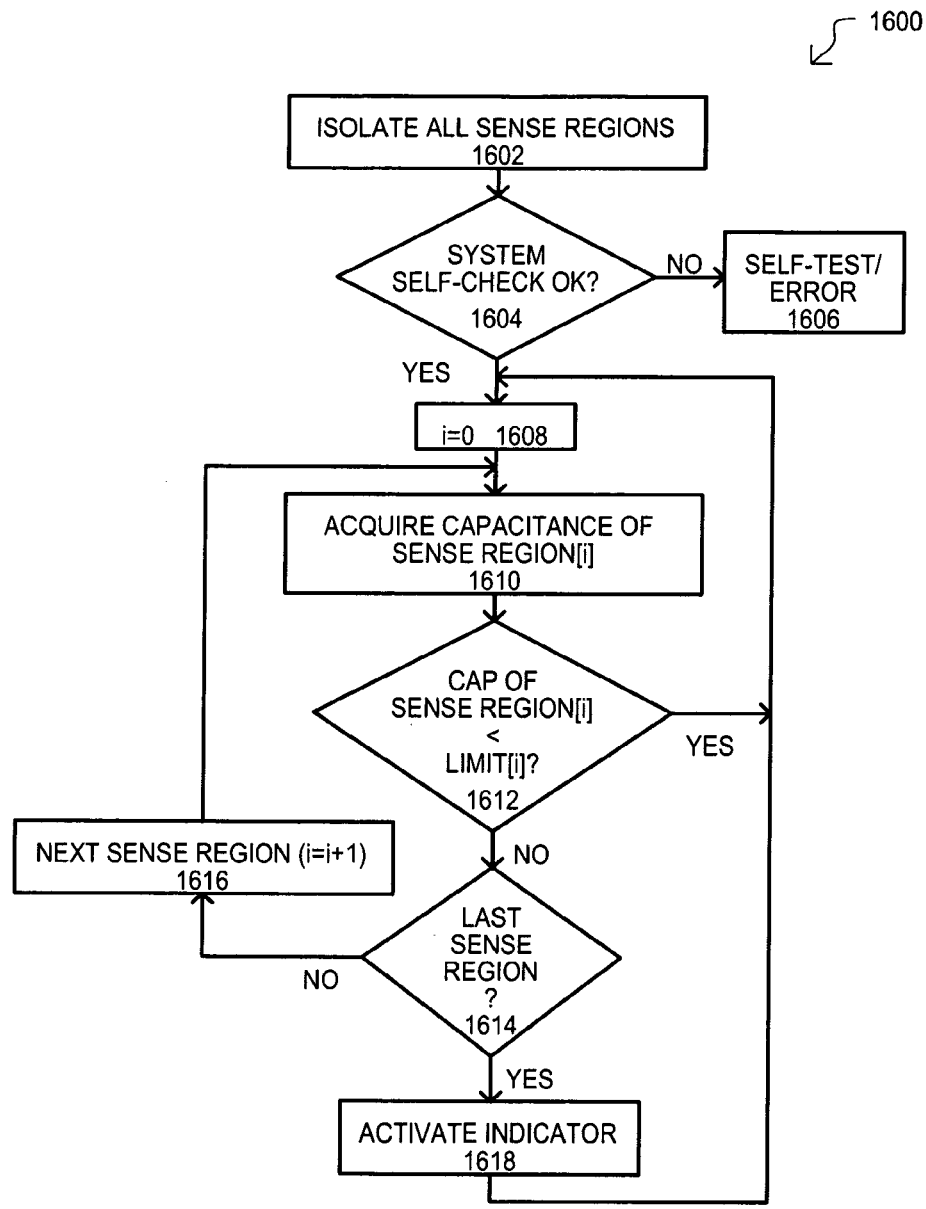
FIG. 16 is a flow diagram showing a second method according to an embodiment.

Referring now to FIG. 16, a method for training finger positions for a sports device according to another embodiment is shown in a flow diagram and designated by the general reference character 1600. A method 1600 can include isolating all sense regions (step 1602). In one particular arrangement, such a step can include turning off switches connecting sense regions to a common sense node. A method 1600 can further include a self-check (step 1604). Such a step can include making a determination that all components of a device are operating properly. If such test indicates the system is not operating properly (NO from 1604), a method can continue to self-test/error indication step (1606). However, if the system is operating properly (YES from 1604), a method can proceed to step 1608.

If system is determined to be operating properly, a method 1600 can sequentially examine a capacitance at each of a number of sense regions. This can include starting with a first sense region, which in FIG. 16 can include setting a variable i=0 (step 1608). A method 1600 can then acquire a capacitance of a selected sense region of a sports device (step 1610). In particular arrangements, such a step can include a capacitance sensing section connecting a sense region to a common sense node, and then charging and discharging the sense node to create transitions at an output of a comparator. The output of the comparator can be connected to a counter circuit, which can generate a count value for the sense region. It is understood that a step 1610 can acquire a capacitance of one capacitance sensor, or that of multiple capacitance sensors.

Referring still to FIG. 16, a method 1600 can continue by determining if an acquired capacitance of a sense region is less than a limit (step 1612). Such a step assumes that presence of a finger results in an increase in capacitance. A limit with which an acquired capacitance value is compared can be a universal limit (i.e., capacitance values for all sense regions compared to a same limit value), but is preferably a limit corresponding particularly to the sense region being examined.

If a capacitance is determined to be below a limit (YES from step 1612), a method can return to step 1608. However, if a capacitance is determined to be above a limit (NO from step 1612), a method can check to see if all sense regions have been examined (step 1614). If all sense regions have not been examined (NO from step 1614), then a method can continue to a next sense region (step 1616) and repeat steps 1610, 1612 and 1614. However, if all sense regions have been examined, and their corresponding capacitances indicate the presence of a finger (YES from step 1614), an indicator can be activated (step 1618), signifying proper finger positions on the sports device.

In this way, a method can sequentially compare capacitances of sense regions to predetermined limits to determine when fingers are in contact with such regions.

While embodiments above have shown methods in which hand positions can be detected (finger position training), other embodiments can include methods for acquiring hand position information. For example, it may be desirable to "program" a sports device embodiment with a particular hand position, in the event proper hand position varies according to device size, hand size or hand shape, as but a few examples. In such embodiments, a user, preferably while being instructed, can place their hand (or hands) on the device, with fingers in the proper position. A device can then acquire these positions, and store them. Subsequently, when the device is used, finger positions can be compared against the programmed finger positions to determine when proper finger position is achieved. One example of such a method is shown in FIG. 17.

Figure 17:
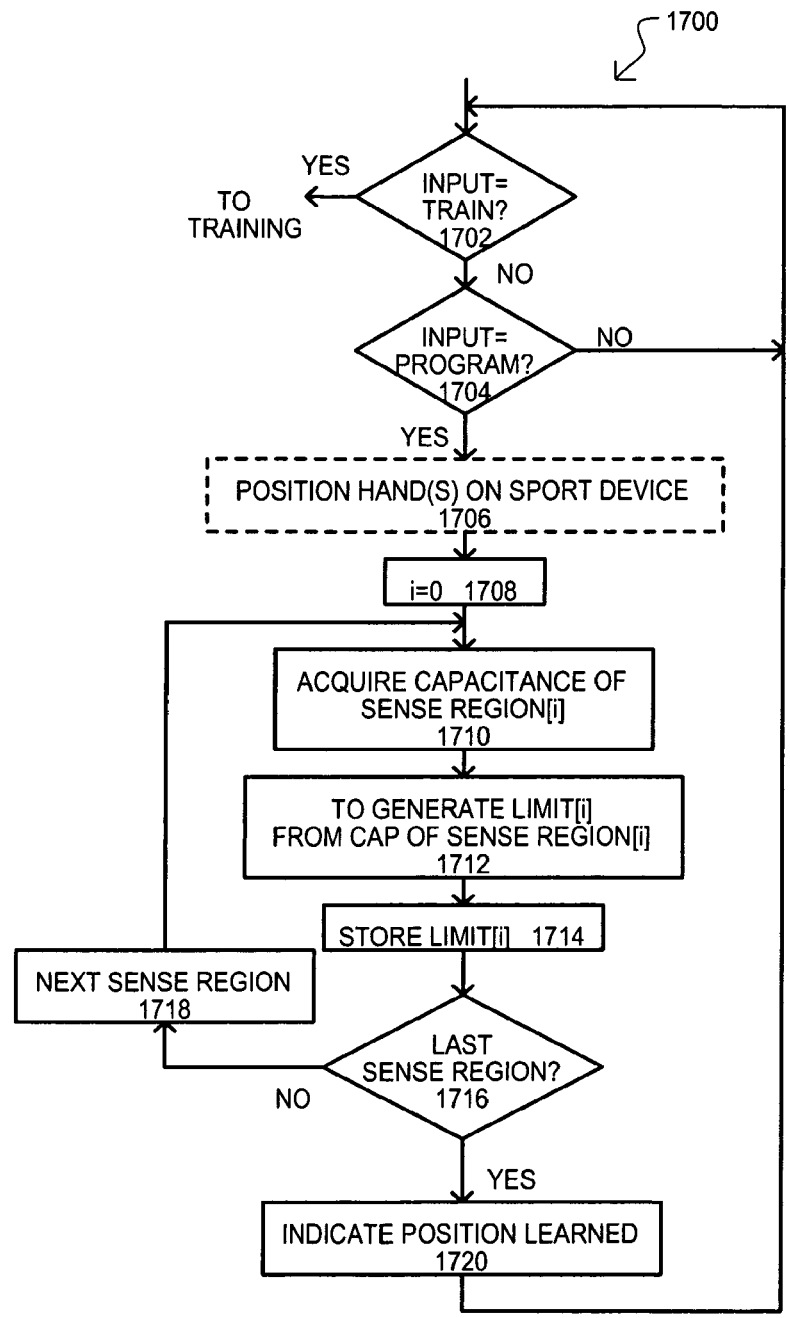
FIG. 17 is a flow diagram showing a third method according to an embodiment.

Referring now to FIG. 17, a method for acquiring finger position information is shown in a flow diagram and designated by the general reference character 1700. A method 1700 can include determining if an input indicates a training operation for the device (step 1702). If a training operation is indicated (YES from 1702), a method can continue to with steps that can indicate when proper finger positions are achieved, like those shown in the embodiments of FIGS. 15 and/or 16. If a training operation is not indicated (NO from 1702), a method can continue determining if a program operation is indicated (step 1704). If a program operation is not indicated (NO from 1704), a method can return to step 1702. If a program operation is indicated (YES from 1704), a method can continue to step 1706.

In one particular arrangement, determining if a train or program operation is indicated can include generating interrupts in response to user inputs. For example, a device can include a button, or other input that can designated a mode (i.e., train or program).

The particular method of FIG. 17 shows an assumed step 1706 that should be performed by a user and not the device. A step 1706 includes a user placing their hand (or hands) on a device with proper finger positions.

A method 1700 can then sequentially acquire a capacitance at each of a number of sense regions. This can include starting with a first sense region, (i=0, step 1708). A method 1700 can then acquire a capacitance of a selected sense region of a sports device (step 1710). As in the case of FIG. 16, step 1710 can include acquiring a capacitance of one capacitance sensor, or that of multiple capacitance sensors. In the very particular example of FIG. 17, a method can also modify sensed capacitance value to generate a limit for the sense region (step 1712). Such a step can include adding margin for greater or lesser sensitivity, or calculating a limit with hysteresis. Once a limit value has been generated, such limit value can be stored (1714). Preferably, such a limit value can be stored in memory circuits on the sports device itself, such as nonvolatile or volatile (e.g., RAM) memory circuits.

Once a limit value for a selected sense region can be created and stored, a method can check to see of all sense regions have been examined (step 1716). If limits for all sense regions have not been created and stored (NO from step 1716), then a method can continue to a next sense region (step 1718) and repeat steps 1710, 1712, 1714, and 1716. However, if limits for all sense regions have been created and stored, an indicator can be activated (step 1720), signifying a hand position has been programmed.

Embodiments of the present invention are well suited to performing various other steps or variations of the steps recited herein, and in a sequence other than that depicted and/or described herein.

For purposes of clarity, many of the details of the various embodiments and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A device, comprising:
   a receiving surface for at least one human hand to grip thereon;
   a plurality of capacitive sensor elements disposed within at least one location on the receiving surface, wherein the capacitive sensor elements generate capacitance measurements;
   a sense circuit coupled to the capacitive sensor elements configured to compare the capacitance measurements with threshold capacitance values, wherein the sense circuit is further configured to generate a signal when the capacitance measurements indicate close proximity of at least a portion of the at least one human hand to the capacitive sensor elements; and
   an indicator configured to receive the signal from the sense circuit and generate an indicator notification when the position of the at least one human hand relative to the receiving surface corresponds with the at least one location on the receiving surface.

2. The device of claim 1 wherein the receiving surface comprises at least a portion of a handle associated with operational equipment.

3. The device of claim 2, wherein the operational equipment is machinery.

4. The device of claim 2 wherein the locations of the capacitive sensor elements are configured and distributed according to a proper hand grip position onto the receiving surface of the handle.

5. The device of claim 1 wherein the threshold capacitance values are an universal value.

6. The device of claim 1 wherein the threshold capacitance values are variable and based on the locations.

7. The device of claim 1, wherein the plurality of capacitive sensor elements is substantially co-planar and formed at least partially underneath the receiving surface.

8. The device of claim 1 wherein the threshold capacitance values of the sense circuit are configured to trigger the indicator notification which indicates physical contacts of at least a portion of the at least one human hand with the capacitive sensor elements.

9. The device of claim 1 wherein the sense circuit is further configured to compare the capacitance measurement of the capacitive sensor elements within each of the location on the receiving surface with the threshold capacitance values sequentially.

10. A circuit, comprising:
    a capacitance sense section coupled to a plurality of capacitor structures disposed within at least one location on a receiving surface for a hand to grip thereon, wherein the capacitance sense section is configured to detect a capacitance value of each capacitor structure selectively;
    a memory circuit;
    a processing section configured to compare the detected capacitance values to capacitance limit values stored in the memory circuit, the processing section is further configured to generate an activation signal when at least one detected capacitance value exceeds the capacitance limit values.

11. The circuit of claim 10 is further coupled to an indicator configured to receive the activation signal and generate a human detectable response when the hand position relative to the receiving surface corresponds with the at least one location.

12. The circuit of claim 11, wherein the human detectable response is a visual signal, an audio signal, a tactile signal or a combination thereof.

13. The circuit of claim 11, wherein the receiving surface is disposed onto an outer surface of a handle of operational equipment, wherein the locations are distributed onto the receiving surface according to a desirable hand position.

14. The circuit of claim 10, wherein the capacitance limit values are an universal value.

15. The circuit of claim 10, wherein the capacitance limit values are variable and selected based on a capacitance threshold when at least a portion of a hand touching the capacitor structures.

16. The circuit of claim 10 further comprising:
    an interface circuit which allows data to be written to the memory circuit, wherein the data includes updated capacitance limit values.

17. The training method of claim 16, wherein the receiving surface comprises at least a portion of an outer surface of an operating handle of the equipment, wherein the grip areas are distributed thereon according to a proper gripping position of the operating handle.

18. The training method of claim 16, wherein the equipment is machinery.

19. The training method of claim 16, wherein the user message indicates the proper gripping position is achieved.

20. A training method, comprising:
    disposing a plurality of capacitance sensors within at least one location on a receiving surface of equipment to form at least one grip area;
    defining at least one capacitance threshold which indicates a touch by at least one finger on the capacitance sensors;
    measuring a capacitance value of each capacitance sensor by a capacitance sense circuit;
    providing a process circuit to determine whether each grip area is touched by at least one finger by comparing the capacitance value of each capacitance sensor with the at least one capacitance threshold;
    generating a signal from the process circuit to an indicator if each grip area is touched; and
    transmitting a user message by the indicator when the position of the at least one finger relative to the receiving surface corresponds with the at least one location on the receiving surface.

* * * * *